Aug. 3, 1965 G. R. STUTZMAN 3,199,067

PRINTED CIRCUIT MULTIPLE CONNECTOR

Filed April 4, 1963

INVENTOR.
Guy R. Stutzman,
BY
H. H. Losche
Paul S. Collignon
Att'ys.

3,199,067
PRINTED CIRCUIT MULTIPLE CONNECTOR
Guy Robert Stutzman, R.R. 2, Greenwood, Ind.
Filed Apr. 4, 1963, Ser. No. 270,778
2 Claims. (Cl. 339—176)
(Granted under Title 35, U.S. Code (1952), sec. 266)

The invention described herein may be manufactured and used by or for the Government of the United States of America for governmental purposes without the payment of any royalties thereon or therefor.

The present invention relates to electrical connectors and more particularly to a connector for making electrical connections to small electronic units that use printed circuits.

There is a constant demand for smaller electrical and electronic components, particularly in the aircraft and missile fields, as weight is of extreme importance. One concept of microelectronics which has been recently developed and which offers a great reduction in size and weight of electronic units is that of integrated circuitry which is formed on insulated bases such as glass, fused silica, or ceramic substrates. Integrated circuitry includes a number of active and passive components which are fabricated by one or more of a combination of several thin film deposition techniques onto a glass or ceramic substrate.

Present day techniques dictate that an integrated circuitry assembly be designed as a plug-in unit, and hence a socket unit for making electrical connections to the board is required. However, the small size of the assembled unit and the very thin layer of deposited films make it difficult to design an adequate connector. Heretofore, most connectors provide a sliding contact arrangement between plugs and sockets, but these cause scraping and abrading of the thin films, which soon become damaged.

One recently developed connector for printed circuit boards is shown in U.S. Patent 3,048,811, issued Aug. 7, 1962, to Tom Lock. In this patent, a plurality of bifurcated socket contacts are provided that are made of a single length of smooth spring wire. The wire is bent to provide two resilient inwardly bowed contact portions that engage the printed circuit board. While this arrangement does permit a plurality of contacts to be mounted in a very small space, nevertheless, there is sliding contact between the wires and the connector pads on the printed circuit board.

In the present invention, a connector frame is provided which has an opening large enough to permit clearance when a circuit board is inserted therein. The circuit board bottoms against a fixed terminal strip with the face of the terminal strip and the face of the deposited film lying in the same plane. A contact plug, which is provided with a plurality of jumper strips mounted on a pad of resilient material, is then inserted into a side opening of the frame and provides a conduction path between the terminal strip and the deposited film. Locking means are provided to keep the contact plug in position.

It is therefore a general object of the persent invention to provide an improved connector for printed circuit boards.

Another object of the present invention is to provide a connector assembly that will not scrape or abrade deposited conductor films.

Other objects and advantages of the present invention will be readily appreciated as the same becomes better understood by reference to the following detailed description when considered in connection with the accompanying drawing wherein.

Figures 1, 2, 3, 4, 5:
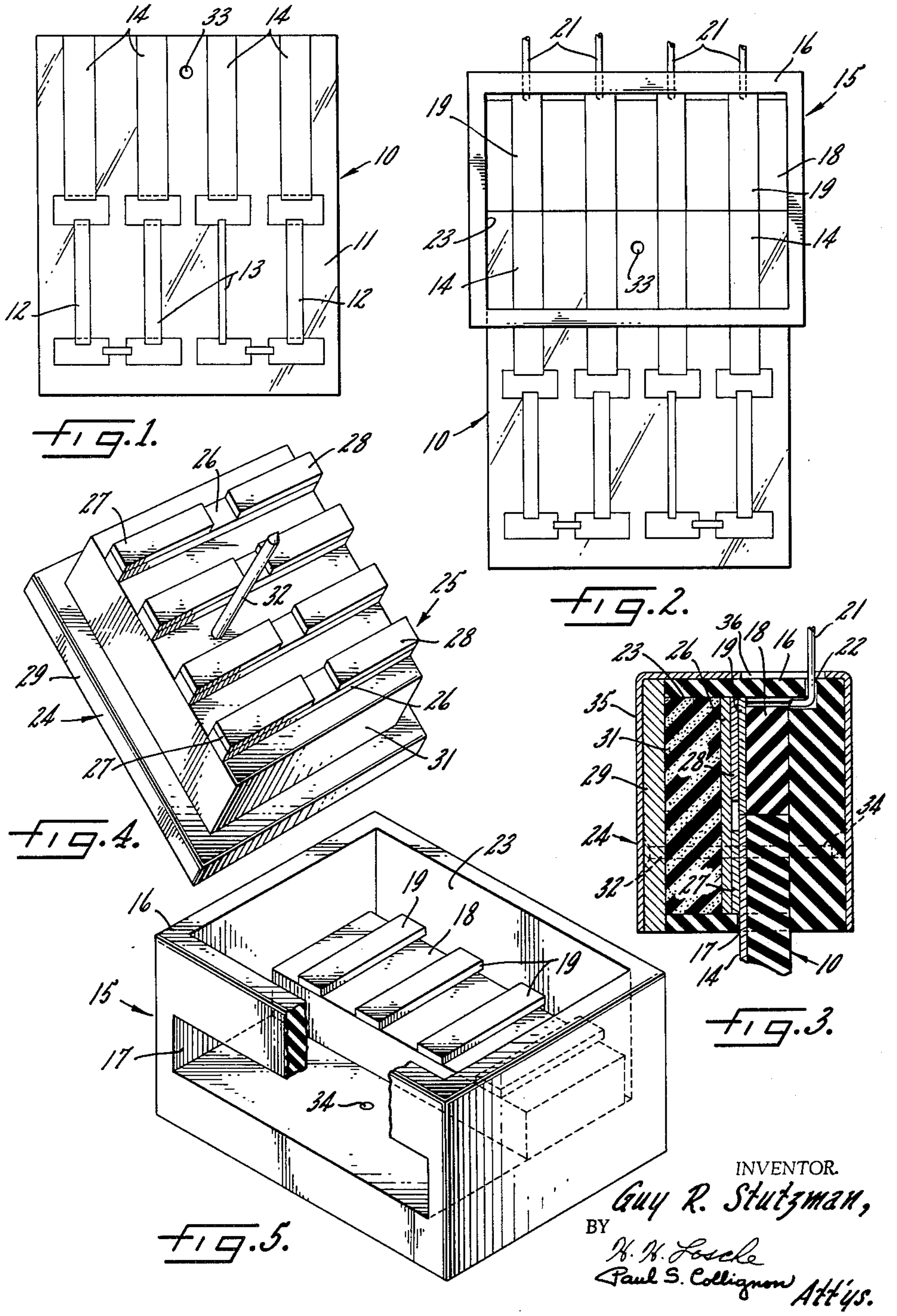
FIGURE 1 is a plan view showing a substrate having an integrated circuit deposited thereon.
FIGURE 2 is a front view showing a board inserted into a connector frame.
FIGURE 3 is a side view, partly in section, of a connector assembly.
FIGURE 4 is a perspective view of a contact plug.
FIGURE 5 is a perspective view of a frame.

Referring now to the drawing, there is shown in FIGURE 1 an integrated circuitry component board 10 comprised of a substrate 11 having electrical components such as resistors 12 and capacitors 13 deposited thereon. The substrate can be of any suitable material such as glass, alumina, beryllia, or barium titanate. The present state of the art of thin-film microcircuitry fabrication permits the deposition of resistors, capacitors, small inductances, and connectors. Thin solid films can be deposited onto substrate by various methods such as electrodeposition, chemical precipitation, thermal decomposition, cathodic sputtering, and high vacuum evaporation. The depositing of film by high vacuum evaporation has been particularly successful as the process is easily controlled, and the deposited films have a high degree of purity.

The various resistors, capacitors, and other components are inter-connected by conducting materials such as chromium-copper alloys or beryllium copper, and likewise the terminal contacts 14 are of good conducting materials. By way of example, the conducting materials may have a thickness of about 0.0015 inch.

Referring now to FIGURES 2, 3, and 5, of the drawing, there is shown an integrated circuitry component board 10 that is mounted in a connector 15. Connector 15 is comprised of a frame 16 that has a longitudinally extending slot 17 therein that is of sufficient length and width so that component board 10 can be inserted therein without scraping or abrading the surfaces that have been deposited on the substrate 11. A block 18 is provided in the bottom portion of slot 17 and is secured thereto by any well-known fastening means, such as rivets or screws. Block 18, which is of an insulating material such as plastic or phenolic, is provided with a plurality of terminal contacts 19 equal in number to the number of terminal contacts 14 on substrate 11. Wires 21 are connected one each to each of the terminal contacts 19 and pass through an opening 22, which is provided in frame 16.

Frame 16 is provided with an opening 23 that is positioned at right angles to, and communicates with, slot 17. As best shown in FIGURES 3 and 4 of the drawing, a contact plug 24 is engageable in opening 23 and is provided with a plurality of conductor strips 25. Conductor strips 25, which by way of example, might be comprised of a flexible plate 26 and a pair of contact plates 27 and 28, are attached to a back plate 29 through a resilient member 31, which might be comprised of sponge, rubber, or plastic. Contact plug 24 is provided with a lock pin 32 that passes through a clearance hole 33 which is provided in component board 10, and then engages in a hole 34 in frame 16. Lock pin 32 thus locks component board 10 in frame 16 when plug 24 is inserted in opening 23. A U-shaped clip 35 is provided to retain contact plug 24 in position. Clip 35 is provided with a slot 36 through which wires 21 can pass.

OPERATION

In operation, component board 10 is inserted in slot 17 so that the end of component board 10 will abut block 18. When component board 10 is abutted against block 18, the terminal contacts 14 on substrate 11 will be in alignment with terminal contacts 19 on block 18, as shown in FIGURE 2 of the drawing. Contact plug 24 is then inserted in opening 23 and conductor strips 25 will bridge contacts 14 and 19 and electrically connect them together. As conductor strips 25 are mounted on a resilient member 31, when pressure is applied to contact plug 24, conductor strips 25 are free to conform to the surface of the contacts and thus a good surface to surface contact is made. Pin 32 passes through hole 33 in component board 10 and then into hole 34 in frame 16 so that component board 10 is locked in position.

It can thus be seen that the present invention provides a small, compact connector for providing electrical connections to a printed circuit board without causing wear or scraping of the electrical contacts thereon. Obviously many modifications and variations of the present invention are possible in the light of the above teachings. It is therefore to be understood, that within the scope of the appended claims, the invention may be practiced otherwise than as specifically described.

What is claimed is:

1. A connector for making electrical connections to a printed circuitry board having a plurality of terminal contacts comprising, a frame having a longitudinally extending slot in one side thereof for receiving a printed circuitry board, and an opening in a side adjacent to said side having said slot and communicating with said slot, a block having a plurality of terminal contacts thereon, said block being positioned in the bottom portion of said opening in a position remote from said slot with said plurality of terminal contacts being disposed in a plane parallel with said side having said opening, a contact plug slidably movable in said opening in a direction perpendicular to said terminal contacts, said plug having a plurality of conductor strips mounted on a resilient cushion, said conductor strips being engageable one each with a terminal contact on said printed circuitry board and a terminal contact on said blocks, means for locking said contact plug in said frame, and locking means on said contact plug for locking said board in said frame.

2. A connector for making electrical connections to a printed circuitry board as set forth in claim 1 wherein said locking means comprises a pin engageable with said board.

References Cited by the Examiner

UNITED STATES PATENTS

| | | | |
|---|---|---|---|
| 2,881,404 | 4/59 | Kamm | 339—17 |
| 2,968,016 | 1/61 | Angele | 339—75 |
| 3,037,181 | 5/62 | Leshner | 339—17 |
| 3,038,140 | 6/62 | Haberland | 339—61 |
| 3,123,422 | 3/64 | Mock et al. | 339—75 |
| 3,129,990 | 4/64 | Rice et al. | 339—17 |

JOSEPH D. SEERS, *Primary Examiner.*